(12) United States Patent
Moosburger et al.

(10) Patent No.: US 9,590,008 B2
(45) Date of Patent: *Mar. 7, 2017

(54) RADIATION-EMITTING SEMICONDUCTOR CHIP

(71) Applicant: OSRAM Opto Semiconductors GmbH, Regensburg (DE)

(72) Inventors: Jürgen Moosburger, Regensburg (DE); Norwin von Malm, Nittendorf-Thumhausen (DE); Patrick Rode, Regensburg (DE); Lutz Höppel, Alteglofsheim (DE); Karl Engl, Niedergebraching (DE)

(73) Assignee: OSRAM Opto Semiconductors GmbH (DE)

( * ) Notice: Subject to any disclaimer, the term of this patent is extended or adjusted under 35 U.S.C. 154(b) by 13 days.

This patent is subject to a terminal disclaimer.

(21) Appl. No.: 14/702,807

(22) Filed: May 4, 2015

(65) Prior Publication Data

US 2015/0236070 A1 Aug. 20, 2015

Related U.S. Application Data

(63) Continuation of application No. 13/123,421, filed as application No. PCT/DE2009/001524 on Oct. 29, 2009, now Pat. No. 9,054,016.

(30) Foreign Application Priority Data

Nov. 28, 2008 (DE) .................. 10 2008 059 580
Jan. 26, 2009 (DE) .................. 10 2009 006 177

(51) Int. Cl.
*H01L 33/62* (2010.01)
*H01L 27/15* (2006.01)
(Continued)

(52) U.S. Cl.
CPC ............ *H01L 27/15* (2013.01); *H01L 33/005* (2013.01); *H01L 33/382* (2013.01); *H01L 33/02* (2013.01);
(Continued)

(58) Field of Classification Search
USPC ............ 257/99, 773, 774, 776, E33.044, 79, 257/E33.001, E33.005, E33.006,
(Continued)

(56) References Cited

U.S. PATENT DOCUMENTS 6,547,249 B2 * 4/2003 Collins, III ........... H01L 27/153 257/88
6,828,596 B2 * 12/2004 Steigerwald ............ H01L 33/08 257/88
(Continued)

FOREIGN PATENT DOCUMENTS

DE  10 2007 022 947 A1  10/2008
DE  10 2007 061 479 A1  6/2009
(Continued)

OTHER PUBLICATIONS

S. Shei et al., Improved Reliability and ESD Characteristics of Flip-Chip GaN-Based LEDs With Internal Inverse-Parallel Protection Diodes, May 2007, IEEE Electron Device Letters, vol. 28, No. 5, pp. 346-349, all pages.*
(Continued)

*Primary Examiner* — Victoria K Hall
(74) *Attorney, Agent, or Firm* — DLA Piper LLP (US)

(57) ABSTRACT

A radiation-emitting semiconductor chip includes a carrier and a semiconductor body having a semiconductor layer sequence, wherein an emission region and a protective diode region are formed in the semiconductor body having the semiconductor layer sequence; the semiconductor layer sequence includes an active region that generates radiation
(Continued)

and is arranged between a first semiconductor layer and a second semiconductor layer; the first semiconductor layer is arranged on a side of the active region facing away from the carrier; the emission region has a recess extending through the active region; the first semiconductor layer, in the emission region, electrically conductively connects to a first connection layer, wherein the first connection layer extends in the recess from the first semiconductor layer toward the carrier; the second semiconductor layer, in the emission region, electrically conductively connects to a second connection layer.

20 Claims, 6 Drawing Sheets

(51) Int. Cl.
  *H01L 33/38* (2010.01)
  *H01L 33/00* (2010.01)
  *H01L 33/02* (2010.01)
(52) U.S. Cl.
  CPC ...... *H01L 33/62* (2013.01); *H01L 2933/0016* (2013.01)
(58) Field of Classification Search
  USPC .................. 257/E33.011, E33.055, 257/E33.062–E33.066, E23.01, E23.141, 257/E23.142, E23.151, E23.169, 257/E23.175, E23.002; 438/22, 26, 28
  See application file for complete search history.

(56) References Cited

U.S. PATENT DOCUMENTS

| | | | | |
|---|---|---|---|---|
| 8,012,856 | B2* | 9/2011 | von Malm | H01L 33/0079 257/E31.099 |
| 8,319,250 | B2* | 11/2012 | Rode | H01L 25/167 257/99 |
| 8,710,537 | B2* | 4/2014 | Engl | H01L 27/15 257/99 |
| 8,946,764 | B2 | 2/2015 | Biwa et al. | |
| 9,054,016 | B2* | 6/2015 | Moosburger | H01L 27/15 |
| 2005/0167680 | A1* | 8/2005 | Shei | H01L 25/167 257/79 |
| 2006/0163601 | A1 | 7/2006 | Harle et al. | |
| 2006/0163604 | A1 | 7/2006 | Shin et al. | |
| 2007/0069218 | A1 | 3/2007 | Chen et al. | |
| 2007/0246716 | A1* | 10/2007 | Bhat | H01L 27/15 257/81 |
| 2007/0258500 | A1* | 11/2007 | Albrecht | H01L 27/15 372/50.11 |
| 2008/0237619 | A1* | 10/2008 | Epler | H01L 33/16 257/98 |
| 2008/0237622 | A1* | 10/2008 | Choi | H01L 33/382 257/98 |
| 2008/0251808 | A1* | 10/2008 | Kususe | H01L 24/06 257/98 |
| 2010/0171135 | A1 | 7/2010 | Engl et al. | |
| 2010/0270578 | A1 | 10/2010 | Sorg et al. | |
| 2012/0223416 | A1* | 9/2012 | Scheubeck | H01L 25/167 257/603 |

FOREIGN PATENT DOCUMENTS

| | | |
|---|---|---|
| EP | 1 580 809 A2 | 9/2005 |
| EP | 1 601 019 A2 | 11/2005 |
| JP | 2007-157926 A | 6/2007 |
| KR | 10 2001 0088929 | 9/2001 |
| WO | 2008/131735 A1 | 11/2008 |

OTHER PUBLICATIONS

S. Shei et al., Improved Protection Diodes, May Reliability and ESD Characteristics of Flip-Chip GaN-Based LEDs With Internal Inverse-Parallel 2007, IEEE Electron Device Letters, vol. 28, No. 5, pp. 346-349, all pages.*

I. Schnitzer et al., "30% external quantum efficiency from surface textured, thin-film light-emitting diodes," Appl. Phys. Lett., vol. 63, No. 16, Oct. 18, 1993, pp. 2174-2176.

Shih-Chang Shei et al., "Improved Reliability and ESD Characteristics of Flip-Chip GaN-Based LEDs With Internal Inverse-Parallel Protection Diodes," IEEE Electron Device Letters, vol. 28, No. 5, May 2007, pp. 346-349.

Korean Notice of Allowance dated Oct. 14, 2016, of corresponding Korean Application No. 10-2011-7014630 in English.

* cited by examiner

RADIATION-EMITTING SEMICONDUCTOR CHIP

RELATED APPLICATIONS

This is a continuation of U.S. application Ser. No. 13/123,421, filed Jul. 11, 2011, which is a §371 of International Application No. PCT/DE2009/001524, with an international filing date of Oct. 29, 2009, which is based on German Patent Application Nos. 10 2008 059 580.2, filed Nov. 28, 2008, and 10 2009 006 177.0, filed Jan. 26, 2009, the subject matter of which is incorporated by reference.

TECHNICAL FIELD

This disclosure relates to a radiation-emitting semiconductor chip.

BACKGROUND

In radiation-emitting semiconductor chips such as light-emitting diodes, for example, electrostatic discharge (ESD) can lead to damage through to destruction. The risk of such damage can be avoided by an additional diode, wherein the forward direction of the diode is oriented in antiparallel with the forward direction of the radiation-emitting semiconductor chip. In the case of that method, therefore, at least one further diode respectively has to be mounted in addition to the radiation-emitting semiconductor chips, which can lead to increased mounting outlay and space requirement and higher production costs associated therewith.

It could therefore be helpful to provide a radiation-emitting semiconductor chip which has a reduced sensitivity toward electrostatic discharge. Furthermore, it could be helpful to provide a simple and reliable method of producing such a semiconductor chip.

SUMMARY

We provide a radiation-emitting semiconductor chip comprising a carrier and a semiconductor body having a semiconductor layer sequence, wherein an emission region and a protective diode region are formed in the semiconductor body having the semiconductor layer sequence; the semiconductor layer sequence comprises an active region that generates radiation, the active region being arranged between a first semiconductor layer and a second semiconductor layer; the first semiconductor layer is arranged on a side of the active region which faces away from the carrier; the emission region has a recess extending through the active region; the first semiconductor layer in the emission region is electrically conductively connected to a first connection layer, wherein the first connection layer extends in the recess from the first semiconductor layer toward the carrier; and the first connection layer in the protective diode region is electrically conductively connected to the second semiconductor layer.

We also provide a method of producing a plurality of radiation-emitting semiconductor chips comprising: providing a semiconductor layer sequence having an active region that generates radiation, the active region being arranged between a first semiconductor layer and a second semiconductor layer; forming a plurality of recesses extending through the second semiconductor layer and through the active region; forming a first connection layer on the semiconductor layer sequence, wherein the first connection layer in the recesses is electrically conductively connected to the first semiconductor layer, and wherein the first connection layer is electrically conductively connected in regions to the second semiconductor layer; forming an assemblage comprising the semiconductor layer sequence and a carrier; forming a plurality of emission regions and a plurality of protective diode regions from the semiconductor layer sequence, wherein the emission regions each have at least one recess and, in the protective diode regions, the first connection layer is electrically conductively connected to the second semiconductor layer; singulating the assemblage into a plurality of semiconductor chips, wherein each semiconductor chip has at least one emission region and at least one protective diode region.

DETAILED DESCRIPTION

Figure 1A:
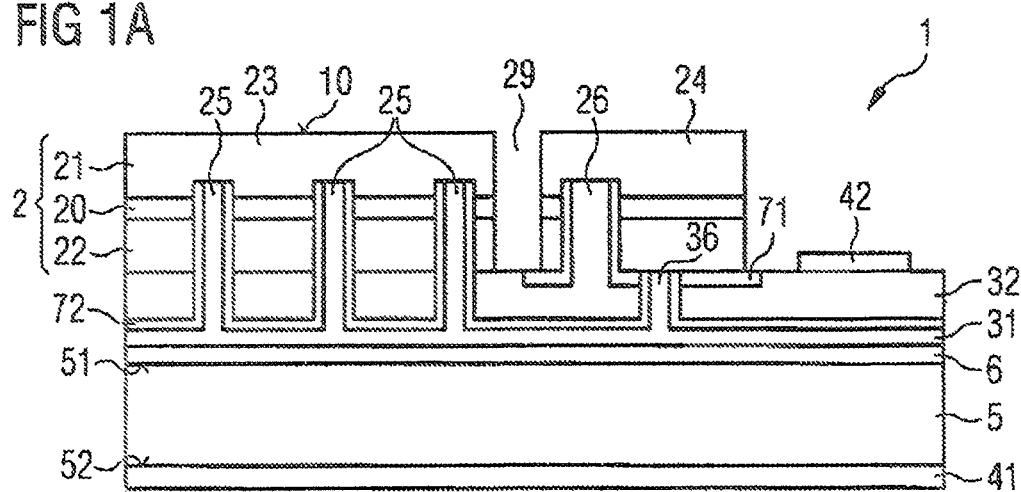
FIGS. 1A and 1B show a first example of a radiation-emitting semiconductor chip in schematic plan view (FIG. 1B) and associated sectional view (FIG. 1A).

In an example, a radiation-emitting semiconductor chip comprises a carrier and a semiconductor body having a semiconductor layer sequence. An emission region and a protective diode region, preferably separate from the emission region, are formed in the semiconductor body. The semiconductor layer sequence comprises an active region provided for generating radiation, the active region being arranged between a first semiconductor layer and a second semiconductor layer. The first semiconductor layer is arranged on that side of the active region which faces away from the carrier. The emission region has at least one recess extending through the active region. The first semiconductor layer, in the emission region, is electrically conductively connected to a first connection layer, wherein the first connection layer extends in the recess from the first semiconductor layer in the direction of the carrier. The first connection layer, in the protective diode region, is electrically conductively connected to the second semiconductor layer.

A protective diode is formed by the protective diode region, which protective diode may be integrated into the semiconductor chip, in particular into the semiconductor body. An undesired voltage, present for instance in the reverse direction at the active region of the emission region at the semiconductor chip, can flow away via the protective diode region. The protective diode region can therefore fulfill, in particular, the function of an ESD diode and, in contrast to the emission region, need not serve for generating radiation. The semiconductor chip can be protected against damage by electrostatic discharge by the protective diode region.

In particular, this protection already exists prior to the mounting of the semiconductor chip, for instance in a housing for the semiconductor chip or on a circuit board. The protection can therefore be obtained independently of an additional protective diode that is arranged outside the semiconductor chip and electrically connected thereto.

The emission region and the protective diode region preferably arise during production from the same semiconductor layer sequence. The deposition of additional semiconductor layers for forming the protective diode region can therefore be dispensed with.

Expediently, the active region of the emission region and the active region of the protective diode region are spaced apart from one another.

Furthermore, the emission region and the protective diode region are preferably arranged alongside one another in a lateral direction, that is to say along a main extension plane of the semiconductor layers of the semiconductor body. The emission region and the protective diode region can therefore be regions of the semiconductor body having the semiconductor layer sequence which are arranged alongside one another in a lateral direction.

Preferably, a cutout is formed between the emission region and the protective diode region, the cutout dividing the semiconductor body into two separate regions laterally separated from one another.

The first semiconductor layer in the emission region and the second semiconductor layer in the protective diode region are electrically conductively connected to one another via the first connection layer, wherein the first connection layer preferably forms an ohmic contact in each case with the first semiconductor layer and with the second semiconductor layer.

An ohmic contact is understood to be, in particular, an electrical connection whose current-voltage characteristic curve has a linear or at least approximately linear profile.

The first semiconductor layer and the second semiconductor layer of the semiconductor body are expediently different from one another with regard to their conduction type. By way of example, the first semiconductor layer can be embodied as p-conducting and the second semiconductor layer as n-conducting, or vice versa.

A diode structure in which the active region is formed is thus realized in a simple manner.

Preferably, the emission region and the protective diode region are connected in antiparallel with one another with regard to their forward direction.

The semiconductor chip furthermore preferably has a first contact and a second contact. The first contact and the second contact can be provided in each case for the external electrical contact-connection of the semiconductor chip. Preferably, the emission region and the protective diode region are in each case electrically conductively connected to the first contact and the second contact. An additional external contact for the protective diode region can therefore be dispensed with. In other words, the semiconductor chip can be embodied in a manner free of an additional external contact that is electrically insulated from the emission region and is electrically conductively connected exclusively to the protective diode region.

An operating voltage present between the first contact and the second contact during the operation of the radiation-emitting semiconductor chip brings about an injection of charge carriers from different sides of the active region into the active region, where the charge carriers can recombine with emission of radiation.

In this case, no or at least no significant current flow takes place through the protective diode region, which is operated in the reverse direction at the operating voltage of the semiconductor chip. By contrast, an electrical voltage present in the reverse direction at the diode structure of the emission region, for example, caused by electrostatic charging, can flow away via the protective diode. The emission region can therefore be protected by a protective diode integrated into the semiconductor chip, in particular into the semiconductor body.

The lateral extent of the protective diode region is preferably small relative to the lateral extent of the semiconductor chip. The smaller the area of the protective diode region, the greater can be the proportion—contributing to the generation of radiation—constituted by the emission region in the total area of the semiconductor chip. The protective diode region preferably covers a maximum of 10%, particularly preferably a maximum of 5%, most preferably a maximum of 1%, of the area of the semiconductor chip.

Preferably, the semiconductor body is cohesively connected to the carrier. The carrier is, in particular, different than a growth substrate for the semiconductor layer sequence of the semiconductor body.

In the case of a cohesive connection, the connection partners, which are preferably prefabricated, are held together by atomic and/or molecular forces. A cohesive connection can be obtained, for example, by a connecting layer, for instance an adhesive layer or a solder layer. In general, separation of the connection is accompanied by the destruction of the connecting layer and/or of at least one of the connection partners.

In one variant, at least one of the contacts of the semiconductor chip can be arranged on that side of the carrier which faces away from the semiconductor body. The injection of charge carriers into the semiconductor body can therefore be effected through the carrier.

The injection of charge carriers can be effected areally through the carrier from the contact into the semiconductor body. In this case, the carrier is preferably embodied as electrically conductive. In a departure from this, in the carrier it is possible to form at least one cutout which preferably extends in a vertical direction through the carrier and which is provided for the electrical contact-connection of the semiconductor body. In this case, the carrier can also be embodied as electrically insulating. The at least one cutout is expediently filled with an electrically conductive material, for example, a metal.

Alternatively, that side of the carrier which faces away from the semiconductor body can be embodied in a manner free of an electrical contact. In other words, both electrical contacts can be arranged on that side of the carrier which faces the semiconductor body. In this case, the carrier is preferably embodied as electrically insulating. In a departure from this, however, an electrically conductive carrier can also be used.

Further alternatively, at least two contacts are arranged on that side of the carrier which faces away from the semiconductor body. In other words, the contact-connection of the semiconductor chip can be effected exclusively from that side of the carrier which faces away from the semiconductor body. By way of example, at least one cutout can in each case be provided in the carrier for the electrical contact-connection of the first connection layer and for the electrical contact-connection of the second connection layer, the at least one cutout preferably extending in each case in a vertical direction through the carrier, which is preferably embodied as electrically insulating.

The carrier can serve, in particular, for the mechanical stabilization of the semiconductor body with the emission region and the protective diode region. The growth substrate for the semiconductor layer sequence of the semiconductor body is no longer required for this purpose and can be removed completely or at least in regions.

By way of example, the carrier can contain a semiconductor material, for instance germanium or silicon or consist of such a material. To increase the electrical conductivity, the carrier can be suitably doped.

By way of example, an electrically insulating carrier can contain a ceramic, for instance aluminum oxide, aluminum nitride or silicon nitride, or consist of such a material.

A semiconductor chip in which the growth substrate is removed is also referred to as a thin-film semiconductor chip.

A thin-film semiconductor chip, for instance a thin-film light-emitting diode chip, is distinguished, in particular, by the following characteristic features:

a reflective layer is applied or formed at a first main area—facing toward a carrier element, for instance the carrier—of a radiation-generating epitaxial layer sequence, the reflective layer reflecting at least part of the electromagnetic radiation generated in the epitaxial layer sequence back into the latter;

the epitaxial layer sequence has a thickness in the range of 20 µm or less, in particular in the region of 10 µm; and the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastically scattering behavior.

A basic principle of a thin-film light-emitting diode chip is described, for example, in I. Schnitzer et al., Appl. Phys. Lett. 63 (16), Oct. 18, 1993, 2174-2176, the disclosure of which is hereby incorporated by reference.

A thin-film light-emitting diode chip is, to a good approximation, a Lambertian surface emitter and is therefore particularly well suited to application in a headlight.

Preferably, the first connection layer runs in regions between the semiconductor body and the carrier. The first semiconductor layer arranged on that side of the active region which faces away from the carrier can be electrically contact-connected by the first connection layer. A radiation exit area of the semiconductor chip, the radiation exit area being formed on that side of the semiconductor body which faces away from the carrier, can therefore be free of layers applied on the prefabricated semiconductor body for the electrical contact-connection of the semiconductor body, in particular free of an external electrical contact of the semiconductor chip.

Preferably, the first connection layer completely covers the carrier in a plan view of the semiconductor chip. Structured application or structuring of the already applied connection layer can therefore be dispensed with during the production of the first connection layer.

Further preferably, the second semiconductor layer, in the emission region, is electrically conductively connected to a second connection layer. The second connection layer can, in particular, at least in regions, directly adjoin the second semiconductor layer.

An ohmic contact with the second semiconductor layer is furthermore preferably formed by the second connection layer in the emission region. The injection of charge carriers into the semiconductor body is thus simplified.

Preferably, the second connection layer runs in regions between the semiconductor body and the carrier. Consequently, the first connection layer and the second connection layer can be formed between the semiconductor body and the carrier. By the first and the second connection layer, the first semiconductor layer and the second semiconductor layer, respectively, can be electrically contact-connected in the emission region from the same side of the semiconductor body. A radiation exit area of the semiconductor chip that is free of external electrical contacts is thus realized in a simple manner.

In other words, the emission region and the protective diode region can be connected in antiparallel with one another by two connection layers, wherein the connection layers each run at least in regions between the semiconductor body and the carrier.

Further preferably, the second connection layer runs in regions between the semiconductor body and the first connection layer, in particular between the emission region and the first connection layer.

Preferably, the second connection layer is reflective with respect to the radiation generated in the active region. Radiation emitted by the active region in the direction of the carrier during the operation of the semiconductor chip can thus be reflected at the second connection layer and subsequently emerge from the semiconductor chip through the radiation exit area. The radiation power emerging in total from the semiconductor chip can thus be maximized more extensively.

Further preferably, the second connection layer, in the protective diode region, is electrically conductively connected to the first semiconductor layer. An antiparallel connection of the emission region and of the protective diode region relatively to their forward direction can thus be realized in a simple manner. In this case, the antiparallel connection can be effected within the semiconductor chip. In other words, the antiparallel connection can be completely integrated into the semiconductor chip.

Furthermore, the integration of the ESD protection into the semiconductor body can be effected independently of the carrier. The carrier can therefore be formed largely independently of the configuration of the protective diode region. In particular, the carrier can be planar and/or unstructured in a lateral direction.

In particular, the protective diode region and the connection layers provided for the antiparallel connection of the protective diode region to the emission region can be formed in a vertical direction completely between a main area of the carrier that faces the semiconductor body and the radiation exit area. The integration of the function of a protective diode into the semiconductor chip can thus be produced in a simple manner.

Alternatively, the protective diode region has a further recess wherein the second connection layer furthermore preferably extends from the first semiconductor layer in the further recess in the direction of the carrier. The first semiconductor layer of the protective diode region can therefore be electrically contact-connected via the further recess through the active region.

One of the contacts of the semiconductor chip, in particular the second contact, is expediently provided for the external electrical contact-connection of the second connection layer. By way of example, the contact, in particular the second contact, can be configured as a bonding pad for a wire bonding connection.

The contact can be formed by an area of the second connection layer that is accessible from outside the semiconductor chip.

In a departure from this, the contact can also be formed by a contact layer that can be provided in addition to the second connection layer. In this case, the contact layer is expediently electrically conductively connected to the second connection layer and furthermore preferably, at least in regions, directly adjoins the latter.

Preferably, the contact layer covers, at least in regions, a side area delimiting the protective diode region in a lateral direction. To avoid an electrical short circuit of the diode structure of the protective diode region, an insulation layer is expediently formed between the contact layer and the side area.

The contact layer can also completely cover the protective diode region laterally. In the case of a contact layer that is non-transmissive with respect to radiation generated in the active region, it is thus possible to avoid a situation in which radiation emerges from the protective diode region in the case of an electrostatic discharge.

In the case of this configuration variant, the first semiconductor layer in the protective diode region on that side of the semiconductor body which faces away from the carrier is electrically conductively connected to the contact layer. In particular, the contact layer can directly adjoin the first semiconductor layer in the protective diode region. The contact-connection of the first semiconductor layer of the protective diode region by the second connection layer running through the further recess can thus be dispensed with.

Furthermore, an electrically conductive connection via the second connection layer to the second semiconductor layer of the emission region is produced by the contact layer. An antiparallel connection of emission region and protective diode region is thus realized in a simple manner.

The contact furthermore preferably covers the protective diode region at least in regions in a plan view of the semiconductor chip. In particular, the contact, embodied as a bonding pad, for instance, can completely cover the protective diode region. In other words, the protective diode region can be integrated into the semiconductor chip below the contact. The protective diode region can therefore be integrated into the semiconductor chip without the area of the emission region additionally having to be reduced for this purpose.

Alternatively, the contact and the protective diode region can be arranged alongside one another in a plan view of the semiconductor chip. The contact can be formed by the second connection layer or by the contact layer arranged on the second connection layer.

The semiconductor body, in particular the active region, furthermore preferably contains a III-V semiconductor material. With III-V semiconductor materials, high internal quantum efficiencies can be achieved during the generation of radiation.

Preferably, the semiconductor chip is a light-emitting diode semiconductor chip, in particular as a thin-film semiconductor chip, which is furthermore preferably provided for generating incoherent or partly coherent radiation.

In a method of producing a plurality of radiation-emitting semiconductor chips, in an example, a semiconductor layer sequence is provided, which has an active region provided for generating radiation, the active region being arranged between a first semiconductor layer and a second semiconductor layer. The semiconductor layer sequence is preferably deposited epitaxially, for instance by MOVPE or MBE. A plurality of recesses are formed, extending through the second semiconductor layer and through the active region. A first connection layer is formed on the semiconductor layer sequence, in particular after the conclusion of the deposition of the semiconductor layer sequence, wherein the first connection layer, in the recesses, is electrically conductively connected to the first semiconductor layer, and wherein the first connection layer is electrically conductively connected in regions to the second semiconductor layer. An assemblage comprising the semiconductor layer sequence and a carrier is formed. A plurality of emission regions and a plurality of protective diode regions are formed from the semiconductor layer sequence, wherein the emission regions each have at least one recess and, in the protective diode regions, the first connection layer is in each case electrically conductively connected to the second semiconductor layer. The assemblage is singulated into a plurality of semiconductor chips, wherein each semiconductor chip has at least one emission region and at least one protective diode region.

In this case, the individual method steps need not necessarily be carried out in the order of the above enumeration.

In the method described, a plurality of semiconductor chips each having a semiconductor body and a carrier arise when the assemblage is singulated. The semiconductor body in each case comprises an emission region and a protective diode region. The semiconductor chips therefore already have an integrated protection against ESD discharges. The risk of damage to the semiconductor chips during the mounting of the semiconductor chips, for example, in housings of optoelectronic components or on circuit boards is thus reduced to the greatest possible extent.

Preferably, a growth substrate for the semiconductor layer sequence, in particular prior to the step of forming the plurality of emission regions and the plurality of protective diode regions from the semiconductor layer sequence, is removed at least in regions. This can be effected mechanically, for example, by grinding, lapping or polishing, and/or chemically, for instance by wet-chemical or dry-chemical etching. Alternatively or supplementarily, a laser stripping method (laser lift-off) can also be employed.

The first connection layer is preferably formed before the emission regions and the protective diode regions are formed, for instance by wet-chemical or dry-chemical structuring, from the semiconductor layer sequence. In particular, the emission regions and the protective diode regions can be formed from the side of the semiconductor layer sequence on which the growth substrate was originally situated.

The first connection layer and/or the second connection layer preferably contain a metal, for instance aluminum, silver, titanium, rhodium, platinum, nickel or gold, or a metallic alloy comprising at least one of the metals mentioned. Furthermore, the first connection layer and/or the second connection layer can also be formed in multilayered fashion.

Alternatively or supplementarily, the first connection layer and/or the second connection layer can also contain a TCO material (transparent conductive oxide), for example, indium tin oxide (ITO) or zinc oxide.

The first and/or the second connection layer can be formed, for example, by a deposition method such as vapor deposition or sputtering on the expediently prefabricated, semiconductor layer sequence.

The method described is particularly suitable for producing a semiconductor chip described further above. Therefore, features mentioned in connection with the semiconductor chip can also be used for the method, and vice versa.

Further features, configurations and expediencies will become apparent from the following description of examples in conjunction with the figures.

Elements that are identical, of identical type or act identically are provided with identical reference symbols in the figures.

The figures and the size relationships of the elements illustrated in the figures among one another should not be regarded as to scale. Rather, individual elements and, in particular, layer thicknesses may be illustrated with an exaggerated size to enable better illustration and/or to afford a better understanding.

Figure 1B:
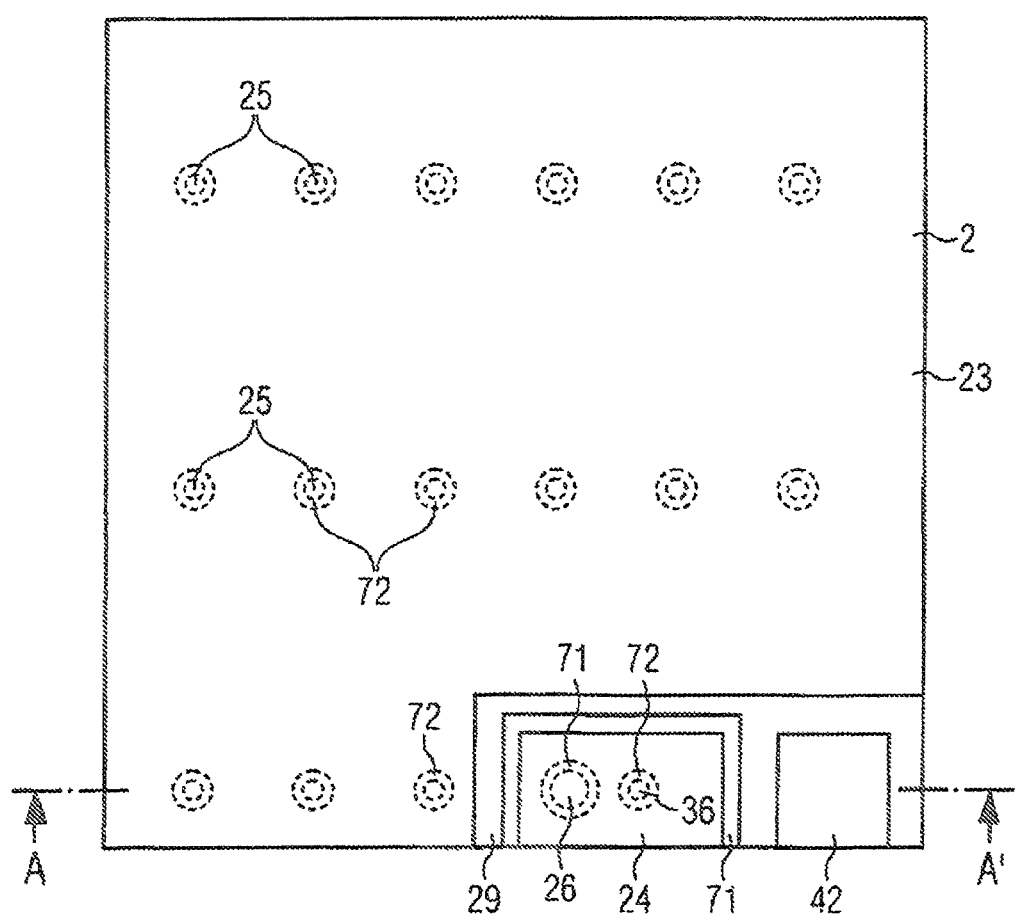

A first example of a radiation-emitting semiconductor chip is illustrated in schematic plan view in FIG. 1B and in associated schematic sectional view along the line AA' in FIG. 1A.

The semiconductor chip 1 has a semiconductor body 2 having a semiconductor layer sequence and a carrier 5. The semiconductor body 2 has an emission region 23 and a protective diode region 24. The emission region and the protective diode region are arranged alongside one another without any overlap in a plan view of the semiconductor chip.

The emission region 23 and the protective diode region 24 are separated from one another by a cutout 29. The cutout extends in a vertical direction, that is to say in a direction perpendicular to a main extension plane of the semiconductor layers of the semiconductor body 2, completely through the semiconductor body 2. An electrical insulation of the protective diode region from the emission region is thus realized in a simple manner.

The semiconductor layer sequence forming the semiconductor body 2 comprises an active region 20 provided for generating radiation, the active region being arranged between a first semiconductor layer 21 and a second semiconductor layer 22. The first semiconductor layer is arranged on that side of the active region which faces away from the carrier 5.

A radiation exit area 10 of the semiconductor chip, in particular of the emission region 23, is formed on that side of the semiconductor body 2 which faces away from the carrier 5. Radiation generated in the active region of the emission region during the operation of the semiconductor chip emerges from the semiconductor chip 1 preferably predominantly through the radiation exit area.

The first semiconductor layer 21 is different than the second semiconductor layer 22 with regard to the conduction type. By way of example, the second semiconductor layer can be embodied in p-conducting fashion and the first semiconductor layer in n-conducting fashion, or vice versa.

The active region 20 is thus arranged in a diode structure.

The semiconductor body 2 with the emission region 23 and the protective diode region 24 is cohesively connected, by a connecting layer 6, to a first main area 51 of the carrier 5, the first main area facing the semiconductor body. The connecting layer can be an adhesive layer or a solder layer, for example.

A first connection layer 31 is formed between the semiconductor body 2 and the carrier 5. In the emission region, the semiconductor body 2 has a plurality of recesses 25 extending through the second semiconductor layer 22 and through the active region 20 into the first semiconductor layer 21. The first connection layer 31 runs through the recesses and produces an electrically conductive connection to the first semiconductor layer 21 from that side of the semiconductor body 2 which faces the carrier.

In the protective diode region 24, the semiconductor body has a further recess 26 extending through the second semiconductor layer 22 and the active region 20 into the first semiconductor layer 21. The further recess is provided for the electrical contact-connection of the first semiconductor layer in the protective diode region.

Furthermore, a second connection layer 32 is formed between the semiconductor body 2 and the carrier 5. The second connection layer 32 serves for the electrical contact-connection of the second semiconductor layer 22 in the emission region 23 of the semiconductor chip.

The semiconductor chip 1 has a first contact 41 and a second contact 42. The contacts are provided for the external electrical contact-connection of the semiconductor chip. During the operation of the semiconductor chip, as a result of an electrical voltage being applied between the contacts, charge carriers can be injected from different sides into the active region and recombine there with emission of radiation.

In the example shown, the semiconductor chip 1 can be electrically contact-connected externally, via the first contact 41, from that side of the carrier 5 which faces away from the semiconductor body 2. The first contact covers, preferably completely or at least substantially completely, a second main area 32 of the carrier, the second main area facing away from the semiconductor body 2.

The first contact 41 is electrically conductively connected to the first connection layer 31 via the carrier 5 and the connecting layer 6.

The second contact 42 is electrically conductively connected to the second connection layer 32 and preferably directly adjoins the second connection layer. In a departure from this, the second contact 42 can also be formed by an externally accessible area of the second connection layer. An additional contact layer is therefore not necessarily required for forming the contact.

In the protective diode region 24, the first semiconductor layer 21 is electrically conductively connected to the second connection layer 32, wherein the second connection layer 32 extends in the further recess 26 from the first semiconductor layer in the direction of the carrier 5. To avoid an electrical short circuit of the active region, a first insulation layer 71 is formed in the region of the further recess 26, the first insulation layer covering the side areas of the further recess 26.

Furthermore, the first insulation layer 71 is formed in the protective diode region 24 between the second semiconductor layer 22 and the second connection layer 32, such that a direct electrical contact between the second connection layer and the second semiconductor layer is avoided in the protective diode region.

The second semiconductor layer 22, in the protective diode region 24, is electrically conductively connected to the first connection layer 31. The second connection layer 32 has a cutout 36, through which the first connection layer extends as far as the second semiconductor layer 22.

To avoid an electrical short circuit of the active region 20 in the emission region 23, a second insulation layer 72 is formed between the side areas of the recesses 25 and the first connection layer 31.

Furthermore, the second insulation layer runs between the first connection layer 31 and the second connection layer 32. An electrical short circuit between these connection layers is thus avoided in a simple manner.

By way of example, the first insulation layer 71 and the second insulation layer 72 can contain an oxide, for instance silicon oxide or titanium oxide, a nitride, for instance silicon nitride, or an oxynitride, for instance silicon oxynitride, or consist of such a material.

The plurality of recesses 25 serves for injecting charge carriers uniformly in a lateral direction via the first semiconductor layer 21 into the active region 20. The recesses 25 can be arranged in a matrix-like fashion or in the form of a honeycomb pattern, by way of example. Particularly given sufficient transverse conductivity of the first semiconductor layer 21, an example of the semiconductor chip which has, in the emission region, only a single recess 25 for the electrical contact-connection of the first semiconductor layer 21 is also conceivable.

In a plan view of the semiconductor chip, the area of the protective diode region 24 is preferably small relative to the area of the emission region 23. In particular, the area of the protective diode region is a maximum of 10%, particularly preferably a maximum of 5%, most preferably a maximum of 1%, of the area of the semiconductor chip 1.

By way of example, the semiconductor chip can have an edge length of 1 mm and the protective diode region can have an edge length of 60 µm. In this example, the protective diode region therefore covers less than 0.4% of the total area of the semiconductor chip, such that the integration of the protective diode region into the semiconductor chip does not lead to a significant reduction of the radiation power emitted by the semiconductor chip.

Even with an area of the protective diode region 24 of 60 µm×60 µm, an ESD protection, for instance in accordance with the standard JESD22-A114-E of the JEDEC Solid State Technology Association, is provided and an ESD pulse can cause only a noncritical temperature increase. The function of a protective diode can therefore be integrated into the semiconductor chip in an extremely compact and easy-to-produce manner.

Figure 2:
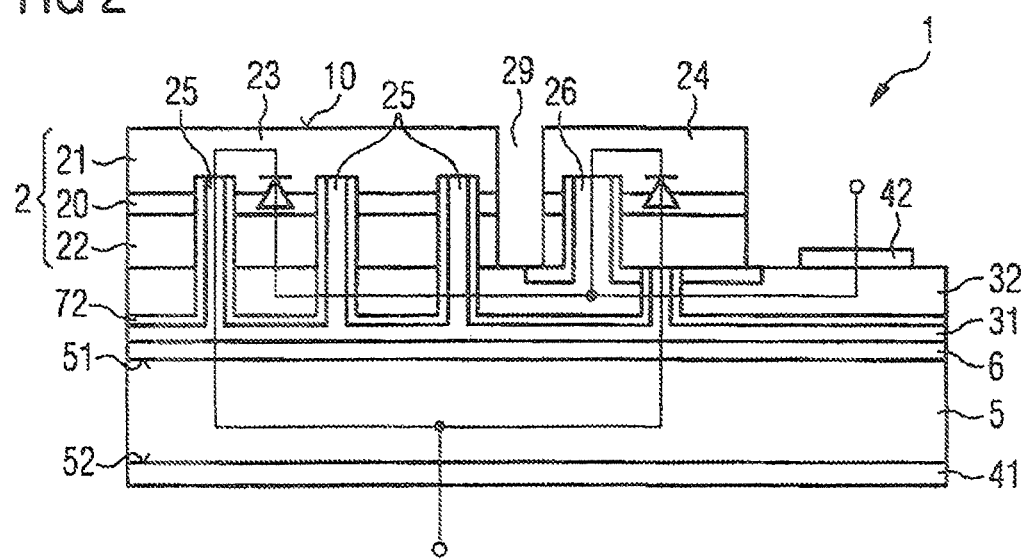
FIG. 2 shows a schematic illustration of the current paths in a semiconductor chip in accordance with the first example illustrated in FIGS. 1A and 1B.

The current paths in the semiconductor chip 1 are illustrated schematically in FIG. 2. The current paths are described by way of example below for the case where the first semiconductor layer is in n-conducting fashion and the second semiconductor layer in p-conducting fashion.

When a positive voltage is present at the second contact 42 relative to the first contact 41, electrons are injected from the first contact 41 through the carrier 5 and the connecting layer 6 via the first connection layer 31 into the first semiconductor layer 21. From the second contact 42, via the second connection layer 32, holes are injected into the second semiconductor layer 22 of the emission region 23, such that the electrons and holes can recombine in the active region 20 with emission of radiation in the emission region. Given this polarity of the externally applied voltage, the emission region is therefore operated in the forward direction.

In contrast to this, in the protective diode region 24, the first semiconductor layer 21 is electrically conductively connected to the second contact 42 via the second connection layer. Furthermore, the second semiconductor layer 22, in the protective diode region 24, is electrically conductively connected to the first contact 41 via the first connection layer 31. The forward direction of the emission region 23 and that of the protective diode region 24 are therefore antiparallel with respect to one another, such that the protective diode region 24 is operated in the reverse direction when the operating voltage of the external contacts 41 and 42 is present. Consequently, no or at least no significant portion of the injected current flows through the protective diode region 24.

By contrast, undesirable voltage, which is present, for example, on account of electrical charging in the emission region 23 in the reverse direction at the active region 20, can flow away via the protective diode region 24. Consequently, the function of a protective diode that protects the emission region against damage by electrostatic discharge is integrated into the semiconductor body 2.

The semiconductor body 2, in particular the active region 20, preferably contains a III-V semiconductor material.

III-V semiconductor materials are particularly suitable for generating radiation in the ultraviolet ($In_xGa_yAl_{1-x-y}N$), through the visible ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral ranges. Here $0 \leq x \leq 1$, $0 \leq y \leq 1$ and $x+y \leq 1$, in particular where $x \neq 1$, $y \neq 1$, $x \neq 0$ and/or $y \neq 0$, hold true in each case. With III-V semiconductor materials, in particular from the material systems mentioned, high internal quantum efficiencies can furthermore be obtained during the generation of radiation.

The first connection layer 31 and/or the second connection layer 32 preferably in each case contain a metal, for example, titanium, platinum, nickel, gold, silver, aluminum or rhodium, or a metallic alloy comprising at least one of the materials mentioned, or consist of a metal or a metallic alloy. Alternatively or supplementarily, the first connection layer 31 and/or the second connection layer 32 can contain a TCO material, for example, ITO or zinc oxide, or consist of such a material.

The second connection layer 32 furthermore preferably has a high reflectivity for the radiation generated in the active region 20. With regard to a high reflectivity, silver, aluminum or rhodium, for example, is suitable in the ultraviolet and blue spectral range, and gold, for example, is suitable in the red and infrared spectral range.

The first contact 41 and the second contact 42 can, in particular, contain a metal mentioned in connection with the first and the second connection layers or a metallic alloy comprising one of these materials or consist of such a material. In particular, materials are suitable with which an external electrical contact-connection can be produced in a simple manner, for instance by a bonding wire or by a soldering connection. By way of example, gold is particularly suitable as material for the contacts.

With a second connection layer in a reflective fashion, the radiation generated in the active region and emitted in the direction of the carrier 5 can be deflected in the direction of the radiation exit area 10 and emerge through the latter from the semiconductor chip.

Furthermore, the protective diode region 24 is formed outside the carrier 5. Therefore, no additional requirements are made of the carrier 5 as a result of the integration of the function of a protective diode into the semiconductor chip. In particular, the carrier can be planar and furthermore completely unstructured. The injection of charge carriers can therefore be effected from the contact areally through the carrier.

By way of example, a semiconductor material, for instance germanium or silicon, which can be doped, is suitable as material for the carrier 5.

In the example shown, the electrical contact-connection of the first connection layer 31 by the first contact 41 and of the second connection layer 32 by the second contact 42 is effected merely by way of example by an arrangement of the contacts 41, 42 on opposite sides of the carrier and injection of charge carriers through an electrically conductive, unstructured carrier.

In a departure from the example described, the carrier 5 can also have at least one cutout extending in a vertical direction through the carrier and filled with an electrically conductive material, for instance a metal. In this case, the carrier can also be embodied in an electrically insulating fashion. By way of example, the carrier can contain a ceramic, for instance aluminum nitride, aluminum oxide or silicon nitride, or consist of such a material.

Furthermore, in a departure from the example shown, that side of the carrier 5 which faces away from the semiconductor body 2 can be embodied in a manner free of an electrical contact. The electrical contacts 41, 42 can therefore be arranged on that side of the carrier which faces the semiconductor body. In this case, the carrier is preferably embodied in electrically insulating fashion. In a departure from this, however, an electrically conductive carrier can also be used.

As a further alternative, in a departure from the example shown, the contacts 41, 42 can be arranged on that side of the carrier 5 which faces away from the semiconductor body 2, such that the semiconductor chip can be electrically contact-connected exclusively from one side of the carrier 5. By way of example, in the carrier for the electrical contact-connection of the first connection layer 31 and for the electrical contact-connection of the second connection layer 32, in each case at least one cutout can be provided in the carrier 5, which is preferably embodied in electrically insulating fashion, the cutout in each case extending in a vertical direction through the carrier 5.

Figure 3A:
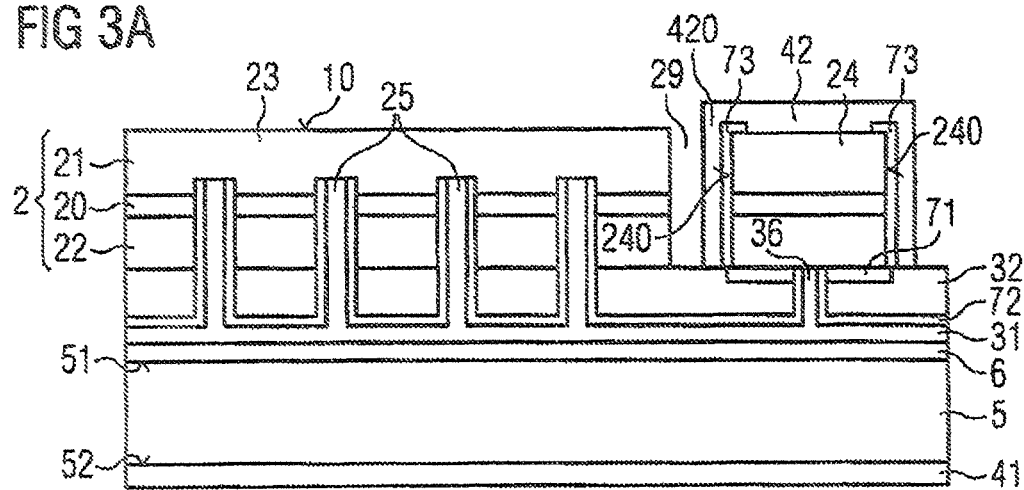
FIGS. 3A and 3B show a second example of a radiation-emitting semiconductor chip in schematic plan view (FIG. 3B) and associated sectional view (FIG. 3A).
Figure 3B:
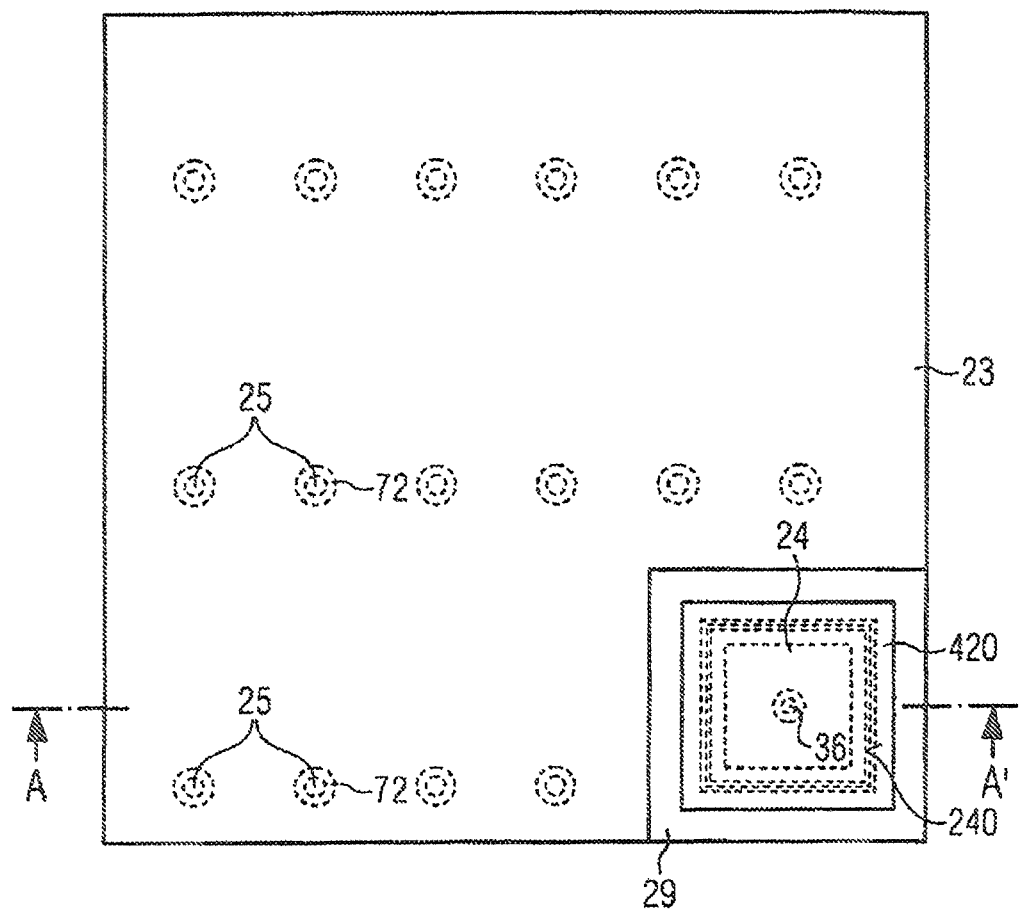

A second example of a semiconductor chip 1 is shown in schematic view in FIGS. 3A and 3B, wherein FIG. 3B illustrates a plan view and FIG. 3A a sectional view along the line AA'.

This second example substantially corresponds to the first example described in connection with FIGS. 1A, 1B and 2. In contrast thereto, the second contact 42 is formed by a contact layer 420. The second contact 42 is formed on that side of the protective diode region 24 which faces away from the carrier 5. In this case, the second contact 42 covers the protective diode region 24 in a plan view of the semiconductor chip.

The contact layer 420 covers a side area 240 of the protective diode region 24 that delimits the protective diode region in a lateral direction.

In the example shown the contact layer 420 extends completely around the protective diode region 24 in a lateral direction and furthermore completely covers the side areas 240 of the protective diode region. In this way, the protective diode region 24 can be completely encapsulated by the contact layer 420. In the case of a contact layer that is non-transmissive with regard to radiation generated in the active region 20, a situation may be avoided in which radiation generated in the protective diode region 24 on account of electrostatic discharge, for example, emerges from the semiconductor chip.

In a departure from this, the contact layer 420 can also cover the side areas 240 of the protective diode region 24 only in regions.

A third insulation layer 73 is arranged between the contact layer 420 and the side areas 240 of the protective diode region 24. An electrical short circuit between the first semiconductor layer 21 and the second semiconductor layer 22 in the protective diode region 24 through the contact layer 420 can thus be avoided.

The contact layer 420 is electrically conductively connected to the second connection layer 32. Consequently, the second contact 42 is electrically conductively connected via the contact layer 420 to the first semiconductor layer 21 of the protective diode region 24 and via the second connection layer 32 to the second semiconductor layer 22 of the emission region, preferably in each case by an ohmic connection.

In contrast to the first example described in connection with FIGS. 1A, 1B and 2, therefore, for the electrical contact-connection of the first semiconductor layer 21 of the protective diode region 24, no further recess extending through the second semiconductor layer 22 and the active region 20 is required in the protective diode region.

As described in connection with the first example, the second semiconductor layer 22 of the protective diode region 24 is electrically conductively connected to the first connection layer 31 and thus via the connecting layer 6 and the carrier 5 to the first contact 41 in an electrically conductive manner, in particular by an ohmic connection. Consequently, once again the protective diode region 24 and the emission region 23 are connected in antiparallel with one another with regard to their forward direction when an external electrical voltage is present between the first contact 41 and the second contact 42.

The contact layer 420 can, in particular, contain the materials mentioned in connection with the connection layers 31, 32 or consist of such a material.

The contact layer 420, with regard to the material, can also be different than the material of the second connection layer 32. Thus, by way of example, the second connection layer 32 can be chosen with regard to a high contact capability with respect to the second semiconductor layer 22 and/or a high reflectivity for radiation generated in the active region 20 and the contact layer 420 can be chosen with regard to a good external electrical contact-connectability, for example, by a wire bonding connection.

The third insulation layer 73 can, in particular, contain the materials described in connection with the first and the second insulation layer 71 and 72, respectively, or consist of such a material.

Figure 4:
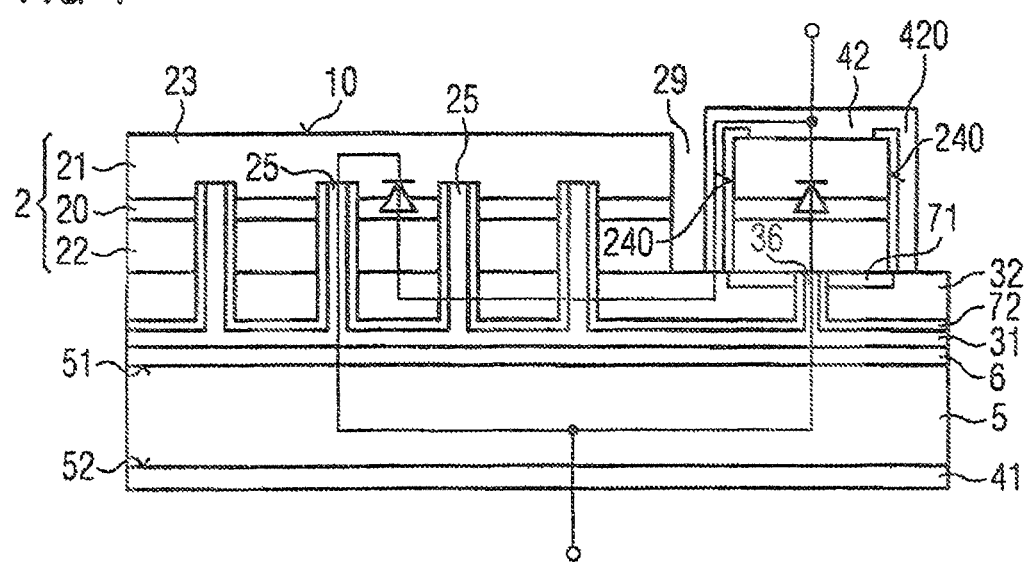
FIG. 4 shows a schematic illustration of the current paths in a semiconductor chip in accordance with the second example illustrated in FIGS. 3A and 3B.

The current paths in a semiconductor chip in accordance with the second example are illustrated schematically in FIG. 4. In this case, the description is given once again by way of example for the case where the second semiconductor layer 22 is doped in p-conducting fashion and the first semiconductor layer 21 is doped in n-conducting fashion.

From the first contact 41, charge carriers can pass firstly via the carrier 5, the connecting layer 6 and the first connection layer 31 through the recesses 25 in the emission region 23 into the first semiconductor layer 21.

Secondly, the first contact 41 is connected via the carrier 5, the connecting layer 6 and the first connection layer 31 to the second semiconductor layer 22 of the protective diode region 24.

The second contact 42 is furthermore connected via the contact layer 420 firstly via the second connection layer 32 to the second semiconductor layer 22 of the emission region and, secondly, the contact 42 is electrically conductively connected to the first semiconductor layer of the protective diode region 24.

With regard to their forward direction, the diode structures of the emission region 23 and of the protective diode region 24 are therefore connected in antiparallel with one another. When a positive electrical voltage is present at the second contact 42 relative to the first contact 41, the diode structure of the emission region 23 is operated in the forward direction, while the protective diode region 24 is operated in the reverse direction.

In the second example, the protective diode region 24 can be formed completely below the second contact 42. In this way, the function of a protective diode can be integrated into the semiconductor chip 1 without additional space for the protective diode being required for this purpose. The protective diode can therefore be integrated into the semiconductor chip whilst maintaining the area of the emission region 23 that can be utilized for generating radiation.

One example of a method of producing a radiation-emitting semiconductor chip is shown in FIGS. 5A to 5F on the basis of intermediate steps illustrated in schematic sectional view in each case.

The method will be described by way of example on the basis of the production of a semiconductor chip embodied in the manner described in connection with FIG. 1.

A semiconductor layer sequence 2 is provided. The semiconductor layer sequence comprises an active region 20 arranged between a first semiconductor layer 21 and a second semiconductor layer 22. The semiconductor layer sequence 2 can be deposited, for example, epitaxially, for instance by MOVPE or MBE. Furthermore, the semiconductor layer sequence 2 can be provided on a growth substrate 8 for the semiconductor layer sequence. In a departure from this, the semiconductor layer sequence 2 can also be provided on an auxiliary carrier that is different than the growth substrate.

The semiconductor layer sequence forms the semiconductor bodies in the completed semiconductor chips.

Figure 5A:
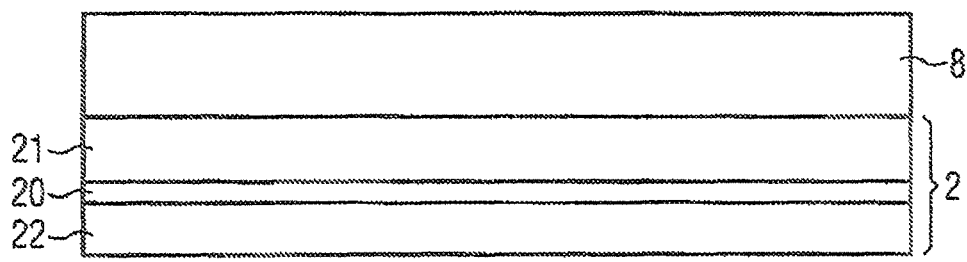
FIGS. 5A to 5F show an example of a method of producing a radiation-emitting semiconductor chip on the basis of intermediate steps illustrated in each case in schematic sectional view.
Figure 5B:
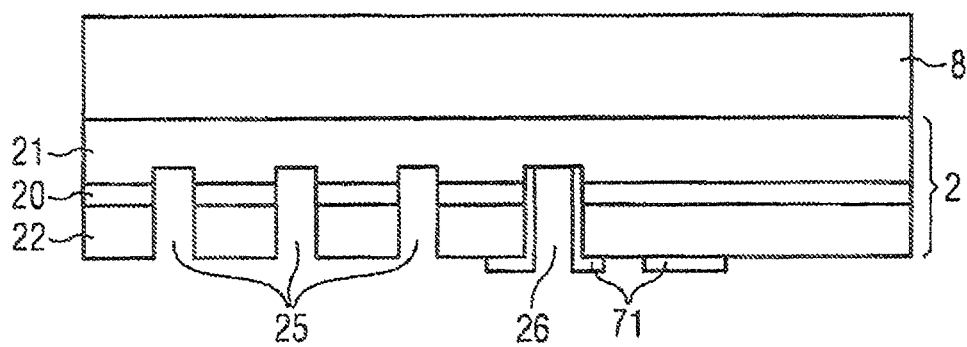

As illustrated in FIG. 5B, recesses 25 are formed from that side of the semiconductor layer sequence which faces away from the growth substrate 8, the recesses extending through the second semiconductor layer 22 and the active region 20 into the first semiconductor layer 21. This is expediently effected after the conclusion of the deposition of the semiconductor layer sequence.

Furthermore, a further recess 26 is formed in the semiconductor body, the further recess likewise extending through the second semiconductor layer 22 and the active region 20 into the first semiconductor layer 21.

The recesses 25 and the further recess 26 can be formed in a common step or successively in different steps, for example, by wet-chemical or dry-chemical etching, in the semiconductor layer sequence.

A first insulation layer 71 is formed on the semiconductor layer sequence 2, the insulation layer covering the side areas of the further recess 26. Furthermore, the first insulation layer 71 also covers part of the top side of the semiconductor layer sequence 2 that faces away from the growth substrate 8.

Figure 5C:
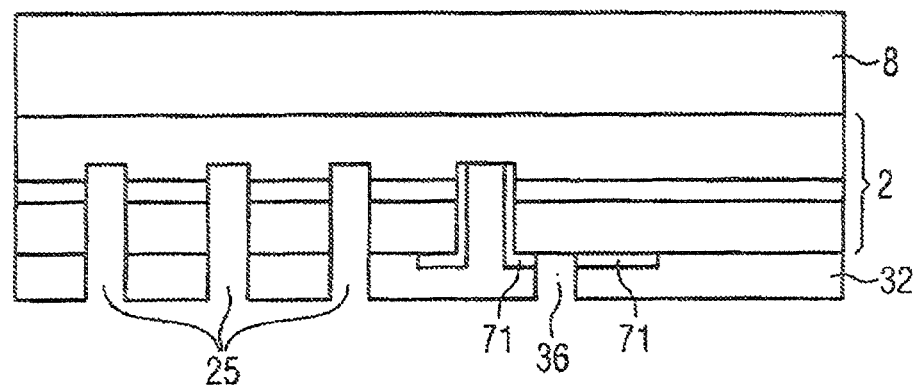
Figure 5D:
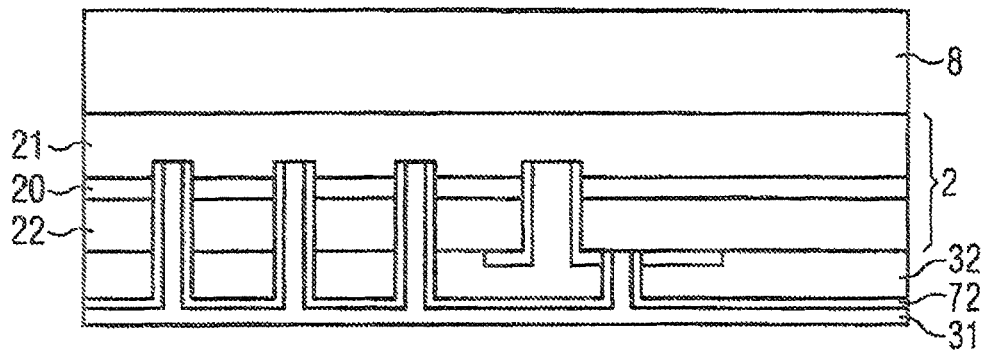

As illustrated in FIG. 5C, a second connection layer 32 is subsequently deposited on the semiconductor body 2. The second semiconductor layer 32 directly adjoins the second semiconductor layer 22 in regions and furthermore extends through the further recess 26 as far as the first semiconductor layer 21 and produces an electrically conductive connection thereto. By contrast, the recesses 25 of the semiconductor layer sequence are free of the material for the second connection layer 32.

The first connection layer 31 and the second connection layer 32 can be deposited by vapor deposition or sputtering, for example.

A second insulation layer 72 is deposited on the second connection layer 32, wherein the second insulation layer covers the side areas of the recesses 25. A region of the recesses 25 that adjoins the first semiconductor layer 21, for instance a bottom area of the recesses, is in a manner free of the second insulation layer in regions.

Furthermore, the second semiconductor layer 22, in the region of a cutout 36 of the second connection layer, is free of the second insulation layer in regions.

A first connection layer 31 is subsequently deposited onto the semiconductor layer sequence 2, wherein the first connection layer completely or at least substantially completely covers the semiconductor layer sequence. Structuring of the first connection layer or structured application of the first connection layer can be dispensed with.

In this case, the first connection layer 31 is electrically conductively connected to the second semiconductor layer 22 in the region of the cutout 36 and connected to the first semiconductor layer 21 of the semiconductor layer sequence in the region of the recesses 25.

Figure 5E:
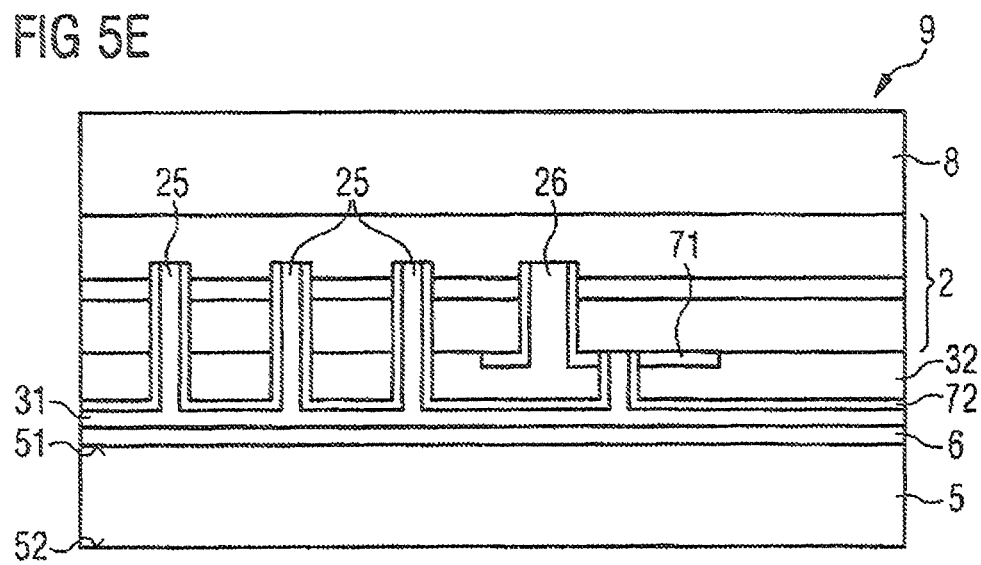

As illustrated in FIG. 5E, an assemblage comprising the semiconductor layer sequence 2, the growth substrate 8 and a carrier 5 is subsequently produced. The carrier 5 is cohesively fixed to the semiconductor layer sequence by a connecting layer 6.

The connection layers 31, 32 are therefore formed on the semiconductor layer sequence already before the assemblage is produced.

The carrier 5 serves for the mechanical stabilization of the semiconductor layer sequence 2. The growth substrate 8 is no longer required for this purpose and can be removed.

The removal can be effected, for example, mechanically, for instance by grinding, lapping or polishing, and/or chemically, for instance by wet-chemical or dry-chemical etching. Alternatively or supplementarily, a laser stripping method can also be used.

Figure 5F:
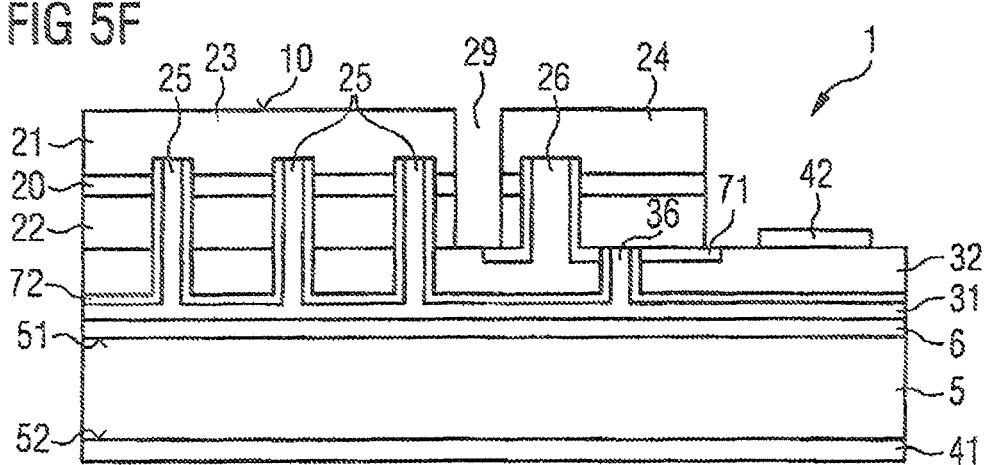

As illustrated in FIG. 5F, a cutout 29 is formed in the semiconductor layer sequence 2, the cutout separating the semiconductor layer sequence 2 into an emission region 23 and a protective diode region 24. Therefore, the formation of the emission region and of the protective diode region is effected only after the formation of the first and second connection layers on the semiconductor layer sequence.

Furthermore, a region of the second connection layer 32 is uncovered by removal of the material of the semiconductor layer sequence 2.

In the region, a second electrical contact 42 can be deposited on the second connection layer 32. In a departure from this, the surface of the second connection layer 32 itself can also be used as the second contact. Furthermore, a first contact 41 is deposited on that side of the carrier 5 which faces away from the semiconductor layer sequence 2. The contacts can be deposited by vapor deposition or sputtering, for example.

The method has been described for the production of only one semiconductor chip merely for the sake of simplified illustration. In the production method, a multiplicity of semiconductor chips can be produced alongside one another, wherein the semiconductor chips arise from the assemblage 9 by the singulation of the assemblage.

The singulation can be effected, for example, mechanically, for instance by cleaving, breaking or water cutting, chemically, for instance by wet-chemical or dry-chemical etching, and/or by laser radiation.

Semiconductor chips each having a semiconductor body 2 with an emission region 23 and a protective diode region 24 arise as a result of the singulation of the assemblage 9 into semiconductor chips. In the semiconductor chips thus produced, therefore, the function of a protective diode is integrated into the semiconductor chip, in particular into the semiconductor body, by the protective diode region 24 as early as during singulation. Consequently, the radiation-emitting semiconductor chip is protected against possible damage on account of electrostatic discharge as early as proceeding from singulation.

This disclosure is not restricted by the description on the basis of the examples. Rather, the disclosure encompasses any novel feature and also any combination of features, which in particular includes any combination of features in the appended claims, even if this feature or this combination itself is not explicitly specified in the claims or the examples.

The invention claimed is:

1. A radiation-emitting semiconductor chip comprising a carrier and a semiconductor body having a semiconductor layer sequence, wherein
   an emission region and a protective diode region are formed in the semiconductor body having the semiconductor layer sequence;
   the semiconductor layer sequence comprises an active region that generates radiation and is arranged between a first semiconductor layer and a second semiconductor layer;
   the first semiconductor layer is arranged on a side of the active region facing away from the carrier;
   the emission region has a recess extending through the active region;
   the first semiconductor layer, in the emission region, electrically conductively connects to a first connection layer, wherein the first connection layer extends in the recess from the first semiconductor layer toward the carrier;
   the second semiconductor layer, in the emission region, electrically conductively connects to a second connection layer, the second connection layer running in regions between the emission region and the first connection layer;
   the first connection layer, in the protective diode region, electrically conductively connects to the second semiconductor layer; and
   the protective diode region has a further recess, wherein the second connection layer extends from the first semiconductor layer in the further recess toward the carrier.

2. The semiconductor chip according to claim 1, wherein the emission region and the protective diode region are connected in antiparallel with one another with regard to their forward direction.

3. The semiconductor chip according to claim 1, wherein the emission region and the protective diode region are regions of the semiconductor body arranged alongside one another in a lateral direction.

4. The semiconductor chip according to claim 1, wherein the semiconductor body cohesively connects to the carrier, and the first connection layer runs in regions between the semiconductor body and the carrier.

5. The semiconductor chip according to claim 1, wherein the second connection layer in the protective diode region electrically conductively connects to the first semiconductor layer.

6. The semiconductor chip according to claim 1, wherein the semiconductor chip has a contact provided for external contact-connection of the second connection layer.

7. The semiconductor chip according to claim 6, wherein the contact and the protective diode region are arranged alongside one another in a plan view of the semiconductor chip.

8. The semiconductor chip according to claim 1, wherein, in the protective diode region, an insulation layer is arranged in regions between the second semiconductor layer and the first connection layer.

9. The semiconductor chip according to claim 8, wherein the insulation layer has a cutout and, in the protective diode region, the first connection layer electrically connects to the second semiconductor layer through the cutout.

10. The semiconductor chip according to claim 8, wherein the insulation layer extends beyond the protective diode region in a plan view of the semiconductor chip at least in regions.

11. The semiconductor chip according to claim 8, wherein the insulation layer covers side areas of the further recess.

12. The semiconductor chip according to claim 1, further comprising a first contact and a second contact for an external electrical contact connection, wherein the first contact electrically conductively connects to the first connection layer and the second contact electrically conductively connects to the second connection layer and at least one of the first contact and the second contact are on a side of the carrier facing away from the semiconductor body.

13. The radiation-emitting semiconductor chip according to claim 1, comprises a first contact and a second contact for an external electrical contact connection, wherein the first contact is arranged on a side of the carrier facing away from the semiconductor body and the second contact is arranged laterally beside the protection diode region and the emission region on the side of the carrier facing the semiconductor body.

14. The radiation-emitting semiconductor chip according to claim 1, wherein the semiconductor body with the emission region and the protective diode region is connected to a first main area of the carrier by a connecting layer wherein the connecting layer completely covers the carrier.

15. The radiation-emitting semiconductor chip according to claim 1, comprising a first contact and a second contact for an external electrical contact connection wherein the first contact and the second contact do not transmit light generated in the active region.

16. A method of producing a plurality of radiation-emitting semiconductor chips comprising:
   a) providing a semiconductor layer sequence having an active region that generates radiation and is arranged between a first semiconductor layer and a second semiconductor layer;
   b) forming a plurality of recesses extending through the second semiconductor layer and through the active region;
   c) forming a second connection layer on the semiconductor layer sequence;
   d) forming a first connection layer on the semiconductor layer sequence, wherein the first connection layer, in the recesses, electrically conductively connects to the first semiconductor layer, and the first connection layer electrically conductively connects in regions to the second semiconductor layer;
   e) forming an assemblage comprising the semiconductor layer sequence and a carrier;
   f) forming a plurality of emission regions and a plurality of protective diode regions from the semiconductor layer sequence, wherein the emission regions each have at least one recess and, in the protective diode regions, the first connection layer electrically conductively connects to the second semiconductor layer and wherein the second connection layer extends in a further recess of the semiconductor layer sequence from the first semiconductor layer toward the carrier; and g) singulating the assemblage into a plurality of semiconductor chips, wherein each semiconductor chip has at least one emission region and at least one protective diode region.

17. The method according to claim 16, wherein, before step f), a growth substrate for the semiconductor layer sequence is removed at least in selected regions.

18. The method according to claim 16, further comprising producing a plurality of semiconductor chips.

19. A radiation-emitting semiconductor chip comprising a carrier, a semiconductor body having a semiconductor layer sequence, and an insulation layer, wherein an emission region and a protective diode region are formed in the semiconductor body having the semiconductor layer sequence;

the semiconductor layer sequence comprises an active region that generates radiation and is arranged between a first semiconductor layer and a second semiconductor layer;

the first semiconductor layer is arranged on a side of the active region facing away from the carrier;

the emission region has a recess extending through the active region;

the first semiconductor layer, in the emission region, electrically conductively connects to a first connection layer, wherein the first connection layer extends in the recess from the first semiconductor layer toward the carrier;

the second semiconductor layer, in the emission region, electrically conductively connects to a second connection layer, the second connection layer running in regions between the emission region and the first connection layer;

the first connection layer, in the protective diode region, electrically conductively connects to the second semiconductor layer;

the protective diode region has a further recess, wherein the second connection layer extends from the first semiconductor layer in the further recess toward the carrier;

the insulation layer covers side areas of the further recess; and the insulation layer extends beyond the protective diode region in a plan view of the semiconductor chip at least in regions.

20. The radiation-emitting semiconductor chip according to claim 19, wherein, in a plan view of the semiconductor chip, the protective diode region extends completely within an outer border of the insulation layer.

* * * * *